US011366554B2

(12) United States Patent
Chou et al.

(10) Patent No.: US 11,366,554 B2
(45) Date of Patent: Jun. 21, 2022

(54) TOUCH CONTROLLER USING SIMULTANEOUSLY GENERATED TRANSMITTING SIGNALS WITH DIFFERENT PHASES AND ASSOCIATED CHIP, TOUCH CONTROL SYSTEM AND TOUCH CONTROL METHOD

(71) Applicant: SHENZHEN GOODIX TECHNOLOGY CO., LTD., Guangdong (CN)

(72) Inventors: Hsin-Jui Chou, Guangdong (CN); Ya-Nan Wen, Guangdong (CN); Po-Yuan Wang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/009,518

(22) Filed: Sep. 1, 2020

(65) Prior Publication Data
US 2020/0401254 A1    Dec. 24, 2020

Related U.S. Application Data

(63) Continuation of application No. PCT/CN2019/077158, filed on Mar. 6, 2019.

(51) Int. Cl.
*G06F 3/044* (2006.01)
*G06F 3/041* (2006.01)
*H03K 17/96* (2006.01)

(52) U.S. Cl.
CPC .......... *G06F 3/044* (2013.01); *G06F 3/04166* (2019.05); *H03K 17/962* (2013.01); *H03K 2017/9613* (2013.01)

(58) Field of Classification Search
CPC .. G06F 3/0412; G06F 3/0416; G06F 9/30043; G06F 1/1643; H03K 17/96; H03K 2217/96031; H03K 17/9622
See application file for complete search history.

(56) References Cited

U.S. PATENT DOCUMENTS 9,417,727 B2 * 8/2016 Park ..................... G06F 3/04166
2013/0021294 A1 * 1/2013 Maharyta ............... G06F 3/0446
345/174

(Continued)

FOREIGN PATENT DOCUMENTS

CN      107636582 A    1/2018
WO   WO2016192151 A1  12/2016

OTHER PUBLICATIONS

International Searching Authority (ISA) Form 210—International Search Report of PCT/CN2019/077158.

(Continued)

*Primary Examiner* — David D Davis
(74) *Attorney, Agent, or Firm* — WPAT, P.C., Intellectual Property Attorneys; Anthony King

(57) ABSTRACT

The application discloses a touch controller to determine a position where a user touches a touchscreen. The touchscreen includes a first transmitting electrode, a second transmitting electrode and a receiving electrode. The touch controller includes a signal generation module and a demodulation module. The signal generation module is configured to perform an in-phase code transmission at a first time so that the receiving electrode receives an in-phase code receiving signal correspondingly, and perform an inverting-phase code transmission at a second time so that the receiving electrode receives an inverting-phase code receiving signal correspondingly. The demodulation module is configured to determine the position where the user touches the touchscreen according to the in-phase code (Continued)

receiving signal corresponding to the first time and the inverting-phase code receiving signal corresponding to the second time.

20 Claims, 5 Drawing Sheets

(56) References Cited

U.S. PATENT DOCUMENTS

2016/0188105 A1* 6/2016 Kremin .................. G06F 3/0446
                                                                  345/174
2017/0123523 A1* 5/2017 Huang ................. G06F 3/04182
2018/0081489 A1* 3/2018 Leigh .................. G06F 3/04182

OTHER PUBLICATIONS

International Searching Authority (ISA) Form 220—Notification of Transmittal of the International Search Report of PCT/CN2019/077158.
International Searching Authority (ISA) Form 237—Written Opinion of PCT/CN2019/077158.
As-filed PCT Request of PCT/CN2019/077158.
As-filed PCT Application of PCT/CN2019/077158.
Notification of Receipt of Search Chinese (Form PCT/ISA/202) of PCT/CN2019/077158.
Notification of the Recording of a Change Form 306 of PCT/CN2019/077158.
PCT RO 105 form for PCT/CN2019/077158.

* cited by examiner

40

402
performing the in-phase coding at a first time, so that the receiving electrode correspondingly generates an in-phase coded receiving signal, wherein when performing the in-phase coding, the signal generation module simultaneously generates a first transmitting signal having a first phase and a second transmitting signal having a second phase to the first transmitting electrode and the second transmitting electrode, respectively, and the first phase and the second phase are orthogonal to each other

404
performing the inverting-phase coding at a second time, so that the receiving electrode correspondingly generates an inverting-phase coded receiving signal, wherein when performing the inverting-phase coding, the signal generation module simultaneously generates the second transmitting signal and the first transmitting signal to the first transmitting electrode and the second transmitting electrode, respectively

406
determining the position where the user touches the touchscreen according to the in-phase coded receiving signal corresponding to the first time and the inverting-phase coded receiving signal corresponding to the second time

502 performing the in-phase coding at a first time, so that the receiving electrode correspondingly generates an in-phase coded receiving signal, wherein when performing the in-phase coding, the signal generation module simultaneously generates a first transmitting signal having a first phase and a second transmitting signal having a second phase to the first transmitting electrode and the second transmitting electrode, respectively, and the first phase and the second phase are not orthogonal to each other

504 performing the inverting-phase coding at a second time, so that the receiving electrode correspondingly generates an inverting-phase coded receiving signal, wherein when performing the inverting-phase coding, the signal generation module simultaneously generates the second transmitting signal and the first transmitting signal to the first transmitting electrode and the second transmitting electrode, respectively

506 determining the position where the user touches the touchscreen according to the first phase, the second phase, the in-phase coded receiving signal corresponding to the first time and the inverting-phase coded receiving signal corresponding to the second time

FIG. 5

TOUCH CONTROLLER USING SIMULTANEOUSLY GENERATED TRANSMITTING SIGNALS WITH DIFFERENT PHASES AND ASSOCIATED CHIP, TOUCH CONTROL SYSTEM AND TOUCH CONTROL METHOD

CROSS-REFERENCE TO RELATED APPLICATION

This application is a continuation of International Application No. PCT/CN2019/077158 filed on Mar. 6, 2019, the application of which is hereby incorporated by reference in its entirety.

TECHNICAL FIELD

The present application relates to a touch controller and associated chip, touch control system and touch control method; in particular, to a touch controller based on phase modulation, and associated chip, touch control system, and touch control method.

BACKGROUND

The touchscreen allows users to use their fingers or stylus to operate and enter information/text/drawings directly on the screen, thereby eliminating the need or trouble for using an input device, such as a keyboard or buttons. Existing touch control technology has been developed to simultaneously (at the same time) use two signals with different frequencies for code transmission on two transmitting electrodes of the touch control system, and the signals carried by different frequencies can be distinguished during the demodulation process. However, this takes up a large bandwidth, and hence, one of the objectives that the industry aims at is how to reduce the signal bandwidth when simultaneously transmitting a plurality of signals to a plurality of electrodes, while at the same time achieve the same performance.

SUMMARY OF THE INVENTION

One purpose of the present application is to disclose a touch controller based on phase modulation and associated chip, touch control system, and touch control method, to address the above-mentioned issues.

One embodiment of the present application discloses a touch controller. The touch controller is configured to determine a position where a user touches a touchscreen, wherein the touchscreen includes a first transmitting electrode, a second transmitting electrode and a receiving electrode. The touch controller includes a signal generation module and a demodulation module. The signal generation module is configured to perform an in-phase code transmission at a first time so that the receiving electrode receives an in-phase code receiving signal correspondingly, and perform an inverting-phase code transmission at a second time so that the receiving electrode receives an inverting-phase code receiving signal correspondingly, wherein when performing the in-phase code transmission, the signal generation module simultaneously generates a first transmitting signal having a first phase and a second transmitting signal having a second phase to the first transmitting electrode and the second transmitting electrode, respectively, and when performing the inverting-phase code transmission, the signal generation module simultaneously generates the second transmitting signal and the first transmitting signal to the first transmitting electrode and the second transmitting electrode, respectively. The demodulation module includes a first mixer and a first integration unit, a second mixer and a second integration unit, and a decoding unit. The first mixer and the first integration unit is arranged for performing in-phase frequency mixing and integration on the in-phase code receiving signal and the inverting-phase code receiving signal, to generate a first in-phase component and a second in-phase component respectively. The second mixer and the second integration unit is arranged for performing quadrature frequency mixing and integration on the in-phase code receiving signal and the inverting-phase code receiving signal, to generate a first quadrature component and a second quadrature component respectively. The decoding unit is configured to determine the position where the user touches the touchscreen according to the first in-phase component, the second in-phase component, the first quadrature component and the second quadrature component.

One embodiment of the present application discloses a chip, and the chip includes the above-mentioned touch controller.

One embodiment of the present application discloses a touch control system, which includes: a touchscreen, including a first transmitting electrode, a second transmitting electrode and a receiving electrode, wherein the receiving electrode is coupled to the first transmitting electrode and the second transmitting electrode; and the above-mentioned touch controller.

One embodiment of the present application discloses a touch control method. The touch control method is configured to determine a position wherein a user touches a touchscreen, wherein the touchscreen includes a first transmitting electrode, a second transmitting electrode and a receiving electrode. The touch control method includes: performing an in-phase code transmission at a first time so that the receiving electrode receives an in-phase code receiving signal correspondingly, wherein when performing the in-phase code transmission, a first transmitting signal having a first phase and a second transmitting signal having a second phase are simultaneously generated to the first transmitting electrode and the second transmitting electrode, respectively; performing an inverting-phase code transmission at a second time so that the receiving electrode receives an inverting-phase code receiving signal correspondingly, wherein when performing the inverting-phase code transmission, the second transmitting signal and the first transmitting signal are simultaneously generated to the first transmitting electrode and the second transmitting electrode, respectively; performing in-phase frequency mixing and integration on the in-phase code receiving signal and the inverting-phase code receiving signal, to generate a first in-phase component and a second in-phase component respectively; performing quadrature frequency mixing and integration on the in-phase code receiving signal and the inverting-phase code receiving signal, to generate a first quadrature component and a second quadrature component respectively; and determining the position where the user touches the touchscreen according to the first in-phase component, the second in-phase component, the first quadrature component and the second quadrature component.

Embodiments of the present application uses two signals with different phases to perform code transmission on two transmitting electrodes of the touch control system, and the two signals with different phases can perform code transmission on the two transmitting electrodes of the touch control system by swapping or not swapping with each other at different time points, thereby obtaining more precise coordinates.

BRIEF DESCRIPTION OF THE DRAWINGS

FIG. 4 is a schematic block diagram illustrating a touch control method according to the first embodiment of the present application.

FIG. 5 is a schematic block diagram illustrating a touch control method according to the second embodiment of the present application.

DETAILED DESCRIPTION

Figure 1:
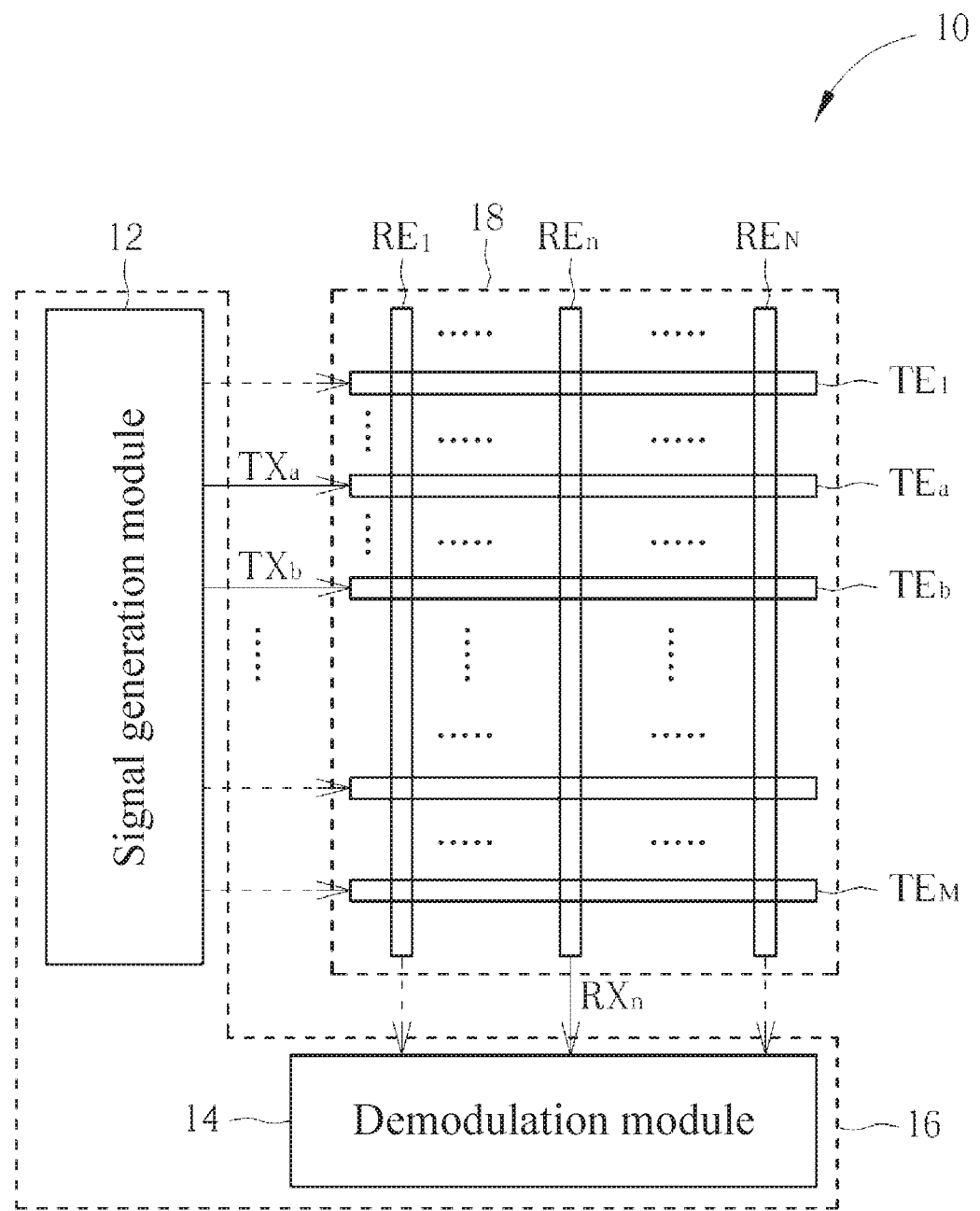
FIG. 1 is a schematic diagram illustrating a touch control system according to one embodiment of the present application.

The following disclosure provides many different embodiments, or examples, for implementing different features of the invention. Specific examples of components and arrangements are described below to simplify the present disclosure. As could be appreciated, these are, of course, merely examples and are not intended to be limiting, For example, the formation of a first feature over or on a second feature in the description that follows may include embodiments in which the first and the second features are formed in direct contact, and may also include embodiments in which additional features may be formed between the first and the second features, such that the first and the second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for the ease of the description to describe one element or feature's relationship with respect to another element(s) or feature(s) as illustrated in the drawings. The spatially relative terms are intended to encompass different orientations of the device in use or operation in addition to the orientation depicted in the figures. The apparatus may be otherwise oriented (e.g., rotated by 90 degrees or at other orientations) and the spatially relative descriptors used herein may likewise be interpreted accordingly.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. As could be appreciated, other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed considering the number of reported significant digits and by applying ordinary rounding techniques. Ranges can be expressed herein as from one endpoint to another endpoint or between two endpoints. All ranges disclosed herein are inclusive of the endpoints, unless specified otherwise.

Referring to 1, which is a schematic diagram illustrating a touch control system 10 according to embodiments of the present application. The touch control system 10 includes a touchscreen 18 and a touch controller 16, wherein the touchscreen 18 includes transmitting electrodes $TE_1$~$TE_M$ and receiving electrodes $RE_1$~$RE_N$, wherein the transmitting electrodes $TE_1$~$TE_M$ and receiving electrodes $RE_1$~$RE_N$ are arranged perpendicular to each other, and each of the receiving electrodes $RE_1$~$RE_N$ is coupled to each of the transmitting electrodes $TE_1$~$TE_M$. The touch controller 16 includes a signal generation module 12 and a demodulation module 14. The signal generation module 12 is coupled to the transmitting electrodes $TE_1$~$TE_M$, and the demodulation module 14 is coupled to the receiving electrodes $RE_1$~$RE_N$.

The present disclosure does not require the use of a pre-stage to obtain the screen body information of the touchscreen 18 in a no-touch situation, but can receive a user's touch directly and use the signal generation module 12 of the touch controller 16 for code transmission and using the demodulation from the demodulation module 14 to generate a demodulation result. The touch control system. 10 can determine the position where the touch event takes place based on the result of the demodulation calculation. The detailed operation means of the touch controller 16 will be described below.

In the present disclosure, sensing can be performed on at least two transmitting electrodes simultaneously, for example, a first transmitting electrode $TE_a$ in the transmitting electrodes $TE_1$~$TE_M$ and a second transmitting signal $TX_b$ can be paired as a group for simultaneous sensing, wherein, the first transmitting electrode $TE_a$ and the second transmitting electrode $TE_b$ may be two consecutive electrodes (i.e., adjacent to each other) or two non-consecutive electrodes (that is at least other transmitting electrode between the first transmitting electrode $TE_a$ and the second transmitting electrode $TE_b$). The code transmission of the signal generation module 12 can be divided into the in-phase code transmission and inverting-phase code transmission; when the signal generation module 12 performs in-phase code transmission, a first transmitting signal $TX_a$ is inputted to the first transmitting electrode $TE_a$, and, a second transmitting signal $TX_b$ is inputted to the second transmitting electrode $TE_b$, simultaneously, so that the receiving electrodes $RE_1$~$RE_N$ receive in-phase code receiving signals correspondingly, wherein the first transmitting signal $TX_a$ and the second transmitting signal $TX_b$ are signals having different phases; specifically, in the present embodiment, the first transmitting signal $TX_a$ and the second transmitting signal $TX_b$ have the same frequency and amplitude, but have different phases. When the signal generation module 12 performs the inverting-phase code transmission, the first transmitting signal $TX_a$ and the second transmitting signal $TX_b$ are swapped with each other, so that the receiving electrodes $RE_1$~$RE_N$ receive the inverting-phase code receiving signal correspondingly. Specifically, in the present embodiment, the first transmitting signal $TX_a$ may have a frequency fc and a first phase, and the second transmitting signal $TX_b$ may have a frequency fc and a second phase, wherein a phase difference between the first phase and the second phase is not zero. The in-phase code transmission and inverting-phase code transmission takes place alternatingly; that is after one in-phase code transmission, one inverting-phase code transmission takes place immediately, followed by one in-phase code transmission immediately, and so on.

The demodulation module 14 can receives the receiving signal from the receiving electrodes $RE_1 \sim RE_N$; for example, in the present embodiment, the demodulation module 14 can receive the receiving signal from one receiving electrode of the receiving electrode $RE_1 \sim RE_N$ one at a time in a specific time order. To facilitate the discussion, the following paragraphs use the receiving signal $RX_n$ from one receiving electrode $RE_n$ of the receiving electrodes $RE_1 \sim RE_N$ as an example to explain how the demodulation module 14 receives the receiving signal.

The demodulation module 14 is configured to determine the position where the user touches the touchscreen according to two consecutive receiving signal $RX_n$ (one corresponding to the in-phase code transmission, and the other corresponding to the inverting-phase code transmission). Specifically, after the demodulation module 14 receives the receiving signal $RX_n$, it performs demodulation calculation on the receiving signal $RX_n$; that is, it calculates and outputs amplitude corresponding to the first phase and amplitude corresponding to the second phase from the receiving signal $RX_n$ according to the receiving signal $RX_n$. In this way, the touch control system 10 can thus determine the capacitance (or the change in the capacitance) of a capacitive node formed between the first transmitting electrode $TE_a$ and the receiving electrode $RE_n$, and determine the capacitance (or the change in the capacitance) between the second transmitting electrode $TE_b$ and the receiving electrode $RE_n$ according to the second amplitude 13, so as to determine whether there is a touch event taking place and determine the position where the user touches the touchscreen.

The demodulation module 14 receives one receiving signal from one receiving electrode at a time in a specified order, and performs demodulation calculation on the receiving signal; however, the present embodiment is not limited thereto, and the present demodulation module can receive a plurality of receiving signals from a plurality of receiving electrodes at once and performs demodulation calculation on these receiving signals respectively. Since the principles for performing demodulation calculation on a plurality of receiving signals respectively are the same as those for performing demodulation calculation on a single receiving signal, the following example will be illustrated by the demodulation module receiving one receiving signal from one receiving electrode at a time and performing demodulation calculation on that receiving signal.

In the first embodiment of the present disclosure, the first phase of the first transmitting signal $TX_a$ and the second phase of the second transmitting signal $TX_b$ are kept orthogonal to each other; during the in-phase code transmission, the first transmitting signal $TX_a$ can be expressed as $\sin(2 \pi f_c t)$ and is transmitted to the first transmitting electrode $TE_a$, the second transmitting signal $TX_b$ can be expressed as $\cos(2 \pi f_c t)$ and is transmitted to the second transmitting electrode $TE_b$; during the inverting-phase code transmission, the second transmitting signal $TX_b$ is transmitted to the first transmitting electrode $TE_a$, and the first transmitting signal $TX_a$ is transmitted to the second transmitting electrode $TE_b$. The first transmitting signal $TX_a$ and the second transmitting signal $TX_a$ generate corresponding signal components correspondingly on the receiving electrode $RE_n$; if the components of transmitting signals other than the first transmitting signal $TX_a$ and the second transmitting signal $TX_b$ on the transmitting electrodes $TE_1 \sim TE_M$ are ignored, during the in-phase code transmission, the receiving signal $RX_n$ can be expressed as $X \cdot \sin(2 \pi f_c t + \theta_a + \theta_x) + Y \cdot \cos(2 \pi f_c t + \theta_b + \theta_y)$, wherein $X \cdot \sin(2 \pi f_c t + \theta_a + \theta_x)$ is the component corresponding to the first transmitting signal $TX_a$, X represents the amplitude corresponding to the first transmitting signal $TX_a$; specifically, when the finger touches a position on the touchscreen corresponding to the first transmitting electrode $TE_a$, X also includes the change in the amplitude of the first transmitting signal $TX_a$ after the touching, $\theta_a$ represents the amount of the phase change in the first transmitting signal $TX_a$ caused by the screen body of the touchscreen 18, $\theta_x$ represents the amount of the phase change in the first transmitting signal $TX_a$ caused by the finger touching the screen body of the touchscreen 18; $Y \cdot \cos(2 \pi f_c t + \theta_b)$ is the component corresponding to the second transmitting signal $TX_b$, Y represents the amplitude corresponding to the second transmitting signal $TX_b$; similarly, when the finger touches a position on the touchscreen corresponding to the second transmitting electrode $TE_b$, Y also includes the change in the amplitude of the second transmitting signal $TX_b$ after the touching, $\theta_b$ represents the amount of the phase change in the second transmitting signal $TX_b$ caused by the screen body of the touchscreen 18, $\theta_y$ represents the amount of the phase change in the second transmitting signal $TX_b$ caused by the finger touching the screen body of the touchscreen 18. While during the inverting-phase code transmission, the receiving signal $RX_n$ can be expressed as $X \cdot \cos(2 \pi f_c t + \theta_a + \theta_x) + Y \cdot \sin(2 \pi f_c t + \theta_b + \theta_y)$, wherein $X \cdot \cos(2 \pi f_c t + \theta_a + \theta_x)$ is the component corresponding to the second transmitting signal $TX_b$, $Y \cdot \sin(2 \pi f_c t \theta_b + \theta_y)$ is the component corresponding to the first transmitting signal $TX_a$, and the meanings of X, Y, $\theta_a$, $\theta_b$, $\theta_x$, $\theta_y$ are the same as those described above in connection with the in-phase code transmission.

Figure 2:
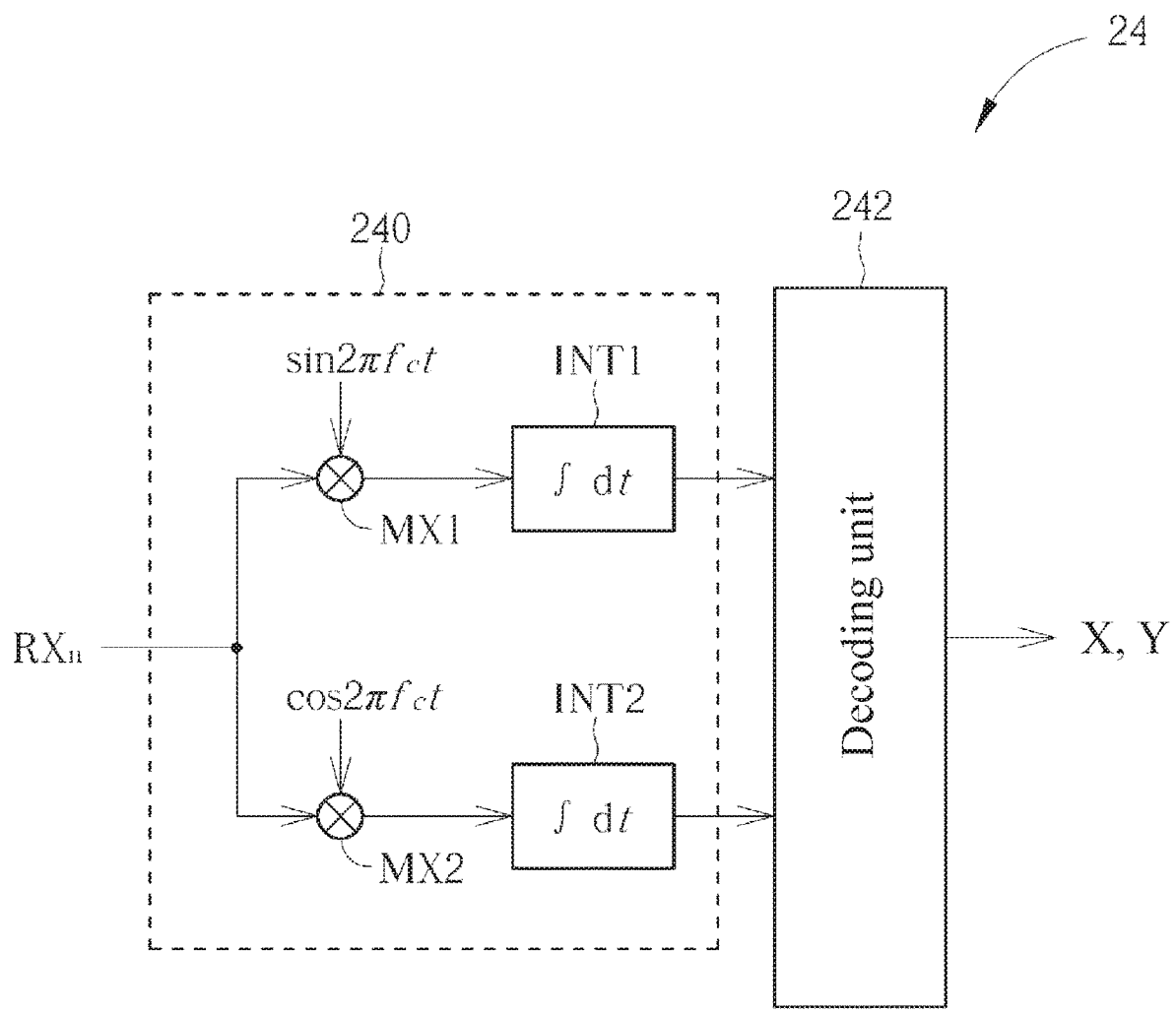
FIG. 2 is a schematic diagram illustrating a signal generation module according to one embodiment of the present application.

Referring to FIG. 2, which is a schematic diagram illustrating a demodulation module 24 according to embodiments of the present application. The demodulation module 24 can be used as a specific implementation of the demodulation module 14, wherein the demodulation module 24 includes a frequency-mixing and integration unit 240 and a decoding unit 242. The frequency-mixing and integration unit 240 includes mixers MX1, MX2 and integrators INT1, INT2, wherein the mixer MX1 and the integrator INT1 are configured to use a local signal $\sin(2 \pi f_c t)$ to perform frequency mixing and integration on the receiving signal $RX_n$, to output an in-phase component of the receiving signal $RX_n$, and the mixer MX2 and integrator INT2 are configured to use a local signal $\cos(2 \pi f_c t)$ to perform frequency mixing and integration on the receiving signal $RX_n$, to output a quadrature component of the receiving signal $RX_n$.

Figure 3:
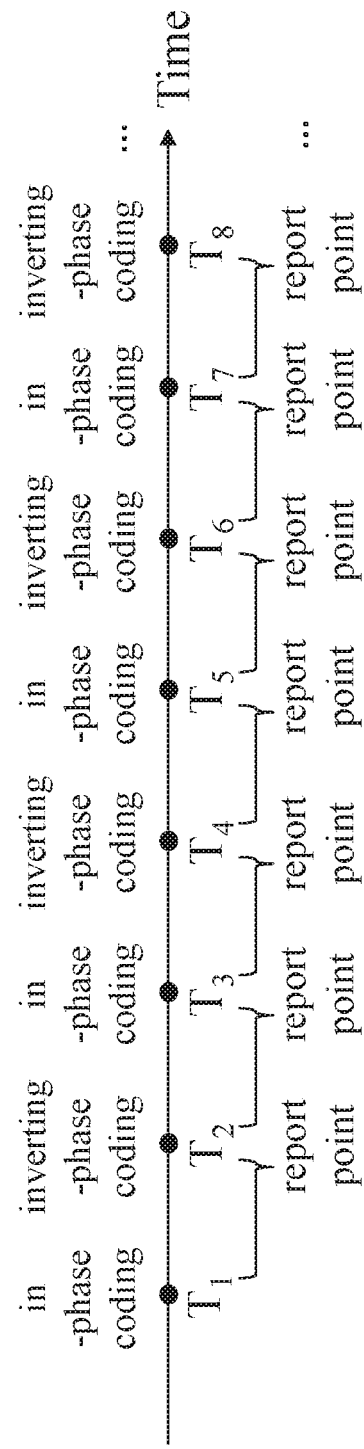
FIG. 3 is a schematic diagram illustrating a code transmission process of a touch control system according to one embodiment of the present application.

Referring to FIG. 3, which is a schematic diagram illustrating a code transmission process performed by a demodulation module 24 according to embodiments of the present application. The signal generation module 12 performs an in-phase code transmission on the transmitting electrodes $TE_a$ and $TE_b$ at time points $T_1$, $T_3$, $T_5$, $T_7$, and performs an inverting-phase code transmission on transmitting electrodes $TE_a$ and $TE_b$ at time points $T_2$, $T_4$, $T_6$, $T_8$. The decoding unit 242 reports point at the time point $T_2$; that is, it uses the information obtained at time points $T_1$ and $T_2$ to generate a demodulation result; the decoding unit 242 reports point at the time point $T_3$; that is, it uses the information obtained at the time points $T_2$ and $T_3$ to generate the demodulation result, and so one.

Reference is made to both FIG. 2 and FIG. 3; during the in-phase code transmission, the following equation is obtained after the receiving signal $RX_n=X\cdot\sin(2\pi f_c t+\theta_a+\theta_x)+Y\cdot\cos(2\pi f_c t+\theta_b+\theta_y)$ passes the mixer MX1 and the integrator INT1:

$$(X\cdot T/2)\cdot\cos(\theta_a+\theta_x)-(Y\cdot T/2)\cdot\sin(\theta_b+\theta_y) \quad (1),$$

and the following equation is obtained after the receiving signal $RX_n$ passes the mixer MX2 and the integrator INT2:

$$(X\cdot T/2)\cdot\sin(\theta_a+\theta_x)+(Y\cdot T/2)\cdot\cos(\theta_b+\theta_y) \quad (2)$$

During the inverting-phase code transmission, the following equation is obtained after the receiving signal $RX_n=X\cdot\cos(2\pi f_c t+\theta_a+\theta_x)+Y\cdot\sin(2\pi f_c t+\theta_b+\theta_y)$ passes the mixer MX1 and the integrator INT1:

$$-(X\cdot T/2)\cdot\sin(\theta_a+\theta_x)+(Y\cdot T/2)\cdot\cos(\theta_b+\theta_y) \quad (3),$$

and the following equation is obtained after the receiving signal $RX_n$ passes the mixer MX2 and the integrator INT2:

$$(X\cdot T/2)\cdot\cos(\theta_a+\theta_x)-(Y\cdot T/2)\cdot\sin(\theta_b+\theta_y) \quad (4);$$

the following equations are obtained through calculation:

$$X\cdot T=\sqrt{(X\cdot T\sin(\theta_a+\theta_x))^2+(X\cdot T\cos(\theta_a+\theta_x))^2} \quad (5)$$

$$Y\cdot T=\sqrt{(Y\cdot T\sin(\theta_b+\theta_y))^2+(X\cdot T\cos(\theta_b+\theta_y))^2} \quad (6),$$

wherein T represents the integration interval of the integrators INT1 and INT2, and since the integration interval T is known, Equation (1)+Equation (4)=$X\cdot T\cdot\cos(\theta_a+\theta_x)$, Equation (2)−Equation (3)=$X\cdot T\cdot\sin(\theta_a+\theta_x)$, Equation (4)−Equation (1)=$Y\cdot T\cdot\sin(\theta_a+\theta_x)$; and Equation (2)+Equation (3)=$Y\cdot T\cos(\theta_a+\theta_x)$; since the Equations (1) (4) are obtained using integrators INT1 and INT2, amplitudes X, Y can be obtained by substituting the same into Equation (5) and Equation (6).

In the above-mentioned first embodiment, the operations of the touch controller 16 can be summarized into a process 40, which is shown in FIG. 4. The process 40 includes the steps as follows.

Step 402: performing the in-phase code transmission at a first time, so that the receiving electrode $RE_n$ correspondingly receives an in-phase code receiving signal $RX_n=X\cdot\sin(2\pi f_c t+\theta_a+\theta_x)+Y\cdot\cos(2\pi f_c t+\theta_b+\theta_y)$, wherein when performing the in-phase code transmission, the signal generation module 12 simultaneously generates a first transmitting signal having a first phase $TX_a=\sin(2\pi f_c t)$ and a second transmitting signal having a second phase $TX_b=\cos(2\pi f_c t)$ to the first transmitting electrode $TE_a$ and the second transmitting electrode $TE_b$, respectively, and the first phase and the second phase are orthogonal to each other.

Step 404: performing the inverting-phase code transmission at a second time, so that the receiving electrode $RE_n$ correspondingly receives an inverting-phase code receiving signal $RX_n=X\cdot\cos(2\pi f_c t+\theta_a+\theta_x)+Y\cdot\sin(2\pi f_c t+\theta_b+\theta_y)$, wherein when performing the inverting-phase code transmission, the signal generation module 12 simultaneously generates the second transmitting signal $TX_b=\cos(2\pi f_c t+\theta_a+\theta_x)$ and the first transmitting signal $TX_a=\sin(2\pi f_c t)$ to the first transmitting electrode $TE_a$ and the second transmitting electrode $TE_b$, respectively.

Step 406: determining the position where the user touches the touchscreen according to the in-phase code receiving signal $RX_n=X\cdot\sin(2\pi f_c t+\theta_a+\theta_x)+Y\cdot\cos(2\pi f_c t+\theta_b+\theta_y)$ corresponding to the first time and the inverting-phase code receiving signal $RX_n=X\cdot\cos(2\pi f_c t+\theta_a+\theta_x)+Y\cdot\sin(2\pi f_c t+\theta_b+\theta_y)$ corresponding to the second time.

Detailed descriptions for the process 40 can be found in preceding relevant paragraphs, and are hence omitted herein for the sake of brevity.

In the second embodiment of the present disclosure, the first phase of the first transmitting signal $TX_a$ and the second phase of the second transmitting signal $TX_b$ are not kept orthogonal to each other; for example, there is a phase difference of (90°+Δ) between the phase of the first transmitting signal $TX_a$ and the phase of the second transmitting signal $TX_b$. In this case, Δ can be any value between 0~360 degrees; for example, when Δ equals 270 degrees, the phase of the first transmitting signal $TX_a$ and the phase of the second transmitting signal $TX_b$ are substantially the same. During the in-phase code transmission, the first transmitting signal $TX_a$ can be expressed as $\sin(2\pi f_c t)$ and is transmitted to the first transmitting electrode $TE_a$, and the second transmitting signal $TX_b$ can be expressed as $\cos(2\pi f_c t+\Delta)$ and is transmitted to the second transmitting electrode $TE_b$; during the inverting-phase code transmission, the second transmitting signal $TX_b$ is transmitted to the first transmitting electrode $TE_a$, and the first transmitting signal $TX_a$ is transmitted to the second transmitting electrode $TE_b$. The first transmitting signal $TX_a$ and the second transmitting signal $TX_b$ generate corresponding signal components on the receiving electrode $RE_n$; if the components of transmitting signals from transmitting electrodes $TE_1$~$TE_M$ other than the first transmitting signal $TX_a$ and the second transmitting signal $TX_b$ are ignored, during the in-phase code transmission, the receiving signal $RX_n$ can be expressed as $X\cdot\sin(2\pi f_c t+\theta_a+\theta_x)+Y\cdot\cos(2\pi f_c t+\theta_b+\theta_y)$, wherein $X\cdot\sin(2\pi f_c t+\theta_a+\theta_x)$ is the component corresponding to the first transmitting signal $TX_a$, X represents the amplitude corresponding to the first transmitting signal $TX_a$, $\theta_a$ represents the amount of the phase change in the first transmitting signal $TX_a$ caused by the screen body of the touchscreen 18, and $\theta_x$ represents the amount of the phase change in the first transmitting signal $TX_a$ caused by the finger touching the screen body of the touchscreen 18; $Y\cdot\cos(2\pi f_c t+\theta_b+\Delta)$ is the component corresponding to the second transmitting signal $TX_b$, Y represents the amplitude corresponding to the second transmitting signal $TX_b$, $\theta_b$ represents the amount of the phase change in the second transmitting signal $TX_b$ caused by the screen body of the touchscreen 18, and $\theta_y$ represents the amount of the phase change in the second transmitting signal $TX_b$ caused by the finger touching the screen body of the touchscreen 18. During the inverting-phase code transmission, the receiving signal $RX_n$ can be expressed as $X\cdot\cos(2\pi f_c t+\theta_a+\theta_x+\Delta)+Y\cdot\sin(2\pi f_c t+\theta_b+\theta_y)$, wherein $X\cdot\cos(2\pi f_c t+\theta_a+\theta_x+\Delta)$ is the component corresponding to the second transmitting signal $TX_b$, $Y\cdot\sin(2\pi f_c t+\theta_b+\theta_y)$ is the component corresponding to the first transmitting signal $TX_a$, and the meanings of X, Y, $\theta_a$, $\theta_b$, $\theta_x$, $\theta_y$ are the same as those described above in connection with the in-phase code transmission.

Similar to the previous embodiment, reference is made to both FIG. 2 and FIG. 3. During the in-phase code transmission, the following equation is obtained after the receiving signal $RX_n=X\cdot\sin(2\pi f_c t+\theta_a+\theta_x)+Y\cdot\cos(2\pi f_c t+\theta_b+\theta_y)$ passes the mixer MX1 and the integrator INT1:

$$(X\cdot T/2)\cdot\cos(\theta_a+\theta_x)-(Y\cdot T/2)\cdot\sin(\theta_b+\theta_y+\Delta) \quad (7),$$

and the following equation is obtained after the receiving signal $RX_n$ passes the mixer MX2 and the integrator INT2:

$$(X\cdot T/2)\cdot\sin(\theta_a+\theta_x)+(Y\cdot T/2)\cdot\cos(\theta_b+\theta_y+\Delta) \quad (8)$$

During the inverting-phase code transmission, the following equation is obtained after the receiving signal $RX_n = X \cdot \cos(2\pi f_c t + \theta_a + \theta_x + \Delta) + Y \cdot \sin(2\pi f_c t + \theta_b + \theta_y)$ passes the mixer MX1 and the integrator INT1:

$$-(X \cdot T/2) \cdot \sin(\theta_a + \theta_x + \Delta) + (Y \cdot T/2) \cdot \cos(\theta_b + \theta_y) \quad (9),$$

and the following equation is obtained after the receiving signal $RX_n$ passes the mixer MX2 and the integrator INT2:

$$(X \cdot T/2) \cdot \cos(\theta_a + \theta_x + \Delta) + (Y \cdot T/2) \cdot \sin(\theta_b + \theta_y) \quad (10);$$

the following equations are obtained through calculation:

$$X \cdot T \approx \cos(\Delta/2) \cdot (X \cdot T \cdot \cos(\Delta/2) - Y \cdot T \cdot \sin(\Delta/2)) + \sin(\Delta/2) \cdot (Y \cdot T \cdot \cos(\Delta/2) - X \cdot T \cdot \sin(\Delta/2)) \quad (11)$$

$$Y \cdot T \approx \sin(\Delta/2) \cdot (X \cdot T \cdot \cos(\Delta/2) - Y \cdot T \cdot \sin(\Delta/2)) + \cos(\Delta/2) \cdot (Y \cdot T \cdot \cos(\Delta/2) - X \cdot T \cdot \sin(\Delta/2)) \quad (12),$$

wherein T represents the integration interval of the integrators INT1 and INT2, and since the integration interval T is known, the decoding unit 242 can calculate the amplitude X, Y using Equation (11) and Equation (12).

In the above-mentioned second embodiment, the operations of the touch controller 16 can be summarized into a process 50, which is shown in FIG. 5. The process 50 includes the steps as follows.

Step 502: performing the in-phase code transmission at a first time, so that the receiving electrode $RE_n$ correspondingly receives an in-phase code receiving signal $RX_n = X \cdot \sin(2\pi f_c t + \theta_a + \theta_x) + Y \cdot \cos(2\pi f_c t + \theta_b + \theta_y + \Delta)$, wherein when performing the in-phase code transmission, the signal generation module 12 simultaneously generates a first transmitting signal having a first phase $TX_a = \sin(2\pi f_c t)$ and a second transmitting signal having a second phase $TX_b = \cos(2\pi f_c t + \Delta)$ to the first transmitting electrode $TE_a$ and the second transmitting electrode $TE_b$, respectively, and the first phase and the second phase are not orthogonal to each other.

Step 504: performing the inverting-phase code transmission at a second time, so that the receiving electrode $RE_n$ correspondingly receives an inverting-phase code receiving signal $RX_n = X \cdot \cos(2\pi f_c t + \theta_a + \theta_x + \Delta) + Y \cdot \sin(2\pi f_c t + \theta_b + \theta_y)$, wherein when performing the inverting-phase code transmission, the signal generation module 12 simultaneously generates the second transmitting signal $TX_b = \cos(2\pi f_c t)$ and the first transmitting signal $TX_a = \sin(2\pi f_c t)$ to the first transmitting electrode $TE_a$ and the second transmitting electrode $TE_b$, respectively.

Step 506: determining the position where the user touches the touchscreen according to the first phase, the second phase and the in-phase code receiving signal $RX_n = X \cdot \sin(2\pi f_c t + \theta_a + \theta_x) + Y \cdot \cos(2\pi f_c t + \theta_b + \theta_y + \Delta)$ corresponding to the first time and the inverting-phase code receiving signal $RX_n = X \cdot \cos(2\pi f_c t + \theta_a + \theta_x + \Delta) \pm Y \cdot \sin(2\pi f_c t + \theta_b + \theta_y)$ corresponding to the second time.

Detailed descriptions for the process 50 can be found in preceding relevant paragraphs, and are hence omitted herein for the sake of brevity.

It should be noted that although the present embodiments uses the time and phase modulation implementation when discussing the in-phase code transmission and inverting-phase code transmission, the present disclosure can use other modulation technologies at the same time; such as, for example, when performing the in-phase code transmission and the inverting-phase code transmission, the following modulation can be performed simultaneously: frequency modulation (e.g., the first transmitting signal $TX_a$ and the second transmitting signal $TX_b$ may have different frequencies, or the frequency may vary with time), other types of time modulation (e.g., simultaneously performing the pulse-width modulation on the first transmitting signal $TX_a$ and the second transmitting signal $TX_b$) or spatial modulation (e.g., simultaneously performing the spatial vector modulation on the first transmitting signal $TX_a$ and the second transmitting signal $TX_b$), and the like.

In some embodiments, the above-mentioned touch controller 16 can be implemented using a semiconductor process; for example, the present application further provides a chip, which includes the touch controller 16, and the chip can be a semiconductor chip implemented using different processes.

The foregoing outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of embodiments introduced herein. Those skilled in the art should also realize that such equivalent embodiments still fall within the spirit and scope of the present disclosure, and they may make various changes, substitutions, and alterations thereto without departing from the spirit and scope of the present disclosure.

What is claimed is:

1. A touch controller, configured to determine a position where a user touches a touchscreen, wherein the touchscreen includes a first transmitting electrode, a second transmitting electrode and a receiving electrode, and the touch controller comprises:

a signal generation module, configured to perform an in-phase code transmission at a first time so that the receiving electrode receives an in-phase code receiving signal correspondingly, and perform an inverting-phase code transmission at a second time so that the receiving electrode receives an inverting-phase code receiving signal correspondingly, wherein when performing the in-phase code transmission, the signal generation module simultaneously generates a first transmitting signal having a first phase and a second transmitting signal having a second phase to the first transmitting electrode and the second transmitting electrode, respectively, and when performing the inverting-phase code transmission, the signal generation module simultaneously generates the second transmitting signal and the first transmitting signal to the first transmitting electrode and the second transmitting electrode, respectively; and a demodulation module, including:

a first mixer and a first integration unit, arranged for performing in-phase frequency mixing and integration on the in-phase code receiving signal and the inverting-phase code receiving signal, to generate a first in-phase component and a second in-phase component respectively;

a second mixer and a second integration unit, arranged for performing quadrature frequency mixing and integration on the in-phase code receiving signal and the inverting-phase code receiving signal, to generate a first quadrature component and a second quadrature component respectively; and a decoding unit, configured to determine the position where the user touches the touchscreen according to the first in-phase component, the second in-phase component, the first quadrature component and the second quadrature component.

2. The touch controller of claim 1, wherein the first transmitting signal and the second transmitting signal have the same frequency.

3. The touch controller of claim 1, wherein the first transmitting signal and the second transmitting signal have the same amplitude.

4. The touch controller of claim 1, wherein the first transmitting signal and the second transmitting signal are orthogonal to each other.

5. The touch controller of claim 1, wherein the signal generation module is further configured to perform an in-phase code transmission at a third time so that the receiving electrode receives an in-phase code receiving signal correspondingly.

6. The touch controller of claim 5, wherein the demodulation module further determines the position where the user touches the touchscreen according to the inverting-phase code receiving signal corresponding to the second time and the in-phase code receiving signal corresponding to the third time.

7. The touch controller of claim 1, wherein the first transmitting signal and the second transmitting signal are not orthogonal to each other.

8. The touch controller of claim 7, wherein the demodulation module further determines the position where the user touches the touchscreen according to the first phase and the second phase.

9. The touch controller of claim 1, wherein the first transmitting electrode and the second transmitting electrode are disposed adjacent to each other.

10. A chip, comprising:
the touch controller of claim 1.

11. A touch control system, comprising:
a touchscreen, including a first transmitting electrode, a second transmitting electrode and a receiving electrode, wherein the receiving electrode is coupled to the first transmitting electrode and the second transmitting electrode; and
the touch controller of claim 1.

12. A touch control method, configured to determine a position wherein a user touches a touchscreen, wherein the touchscreen includes a first transmitting electrode, a second transmitting electrode and a receiving electrode, and the touch control method comprises:
performing an in-phase code transmission at a first time so that the receiving electrode receives an in-phase code receiving signal correspondingly, wherein when performing the in-phase code transmission, a first transmitting signal having a first phase and a second transmitting signal having a second phase are simultaneously generated to the first transmitting electrode and the second transmitting electrode, respectively;
performing an inverting-phase code transmission at a second time so that the receiving electrode receives an inverting-phase code receiving signal correspondingly, wherein when performing the inverting-phase code transmission, the second transmitting signal and the first transmitting signal are simultaneously generated to the first transmitting electrode and the second transmitting electrode, respectively;
performing in-phase frequency mixing and integration on the in-phase code receiving signal and the inverting-phase code receiving signal, to generate a first in-phase component and a second in-phase component respectively;
performing quadrature frequency mixing and integration on the in-phase code receiving signal and the inverting-phase code receiving signal, to generate a first quadrature component and a second quadrature component respectively; and
determining the position where the user touches the touchscreen according to the first in-phase component, the second in-phase component, the first quadrature component and the second quadrature component.

13. The touch control method of claim 12, wherein the first transmitting signal and the second transmitting signal have the same frequency.

14. The touch control method of claim 12, wherein the first transmitting signal and the second transmitting signal have the same amplitude.

15. The touch control method of claim 12, wherein the first transmitting signal and the second transmitting signal are orthogonal to each other.

16. The touch control method of claim 12, further comprises:
performing an in-phase code transmission at a third time so that the receiving electrode receives an in-phase code receiving signal correspondingly.

17. The touch control method of claim 16, further comprising:
determining the position where the user touches the touchscreen according to the inverting-phase code receiving signal corresponding to the second time and the in-phase code receiving signal corresponding to the third time.

18. The touch control method of claim 12, wherein the first transmitting signal and the second transmitting signal are not orthogonal to each other.

19. The touch control method of claim 18, further comprising:
determining the position where the user touches the touchscreen according to the first phase and the second phase.

20. The touch control method of claim 12, wherein the first transmitting electrode and the second transmitting electrode are disposed adjacent to each other.

* * * * *